United States Patent
Song

(10) Patent No.: US 11,255,014 B2
(45) Date of Patent: Feb. 22, 2022

(54) APPARATUS FOR DEPOSITING METAL FILM ON SURFACE OF THREE-DIMENSIONAL OBJECT

(71) Applicant: TETOS Co., Ltd., Asan-si (KR)

(72) Inventor: Kun Ho Song, Asan-si (KR)

(73) Assignee: TETOS Co., Ltd., Asan-si (KR)

( * ) Notice: Subject to any disclaimer, the term of this patent is extended or adjusted under 35 U.S.C. 154(b) by 84 days.

(21) Appl. No.: 16/563,934

(22) Filed: Sep. 9, 2019

(65) Prior Publication Data

US 2020/0102646 A1 Apr. 2, 2020

(30) Foreign Application Priority Data

Oct. 1, 2018 (KR) .................. 10-2018-0116744

(51) Int. Cl.
| C23C 14/50 | (2006.01) |
| C23C 14/14 | (2006.01) |
| C23C 14/34 | (2006.01) |
| H01L 23/552 | (2006.01) |

(52) U.S. Cl.
CPC ............ *C23C 14/505* (2013.01); *C23C 14/14* (2013.01); *C23C 14/34* (2013.01); *H01L 23/552* (2013.01)

(58) Field of Classification Search
CPC ......... H01L 23/552; H01L 2224/16227; H01L 2224/48227; H01L 25/167; C23C 14/505; C23C 14/14; C23C 14/34; C23C 14/046; C23C 14/185; C23C 14/568; C23C 14/3464; C23C 14/04; C23C 14/165
See application file for complete search history.

(56) References Cited

U.S. PATENT DOCUMENTS

| 6,287,430 B1* | 9/2001 | Matsumoto ........... C23C 14/568 118/719 |
| 6,409,859 B1* | 6/2002 | Chung ..................... B32B 7/12 156/250 |
| 9,461,001 B1* | 10/2016 | Tsai ........................ H02J 7/025 |
| 2009/0104735 A1* | 4/2009 | Ito ........................... H01L 23/60 438/121 |
| 2011/0221046 A1* | 9/2011 | Xiao ..................... H01L 23/552 257/659 |

(Continued)

FOREIGN PATENT DOCUMENTS

| JP | 2006299362 A | * 11/2006 |
| JP | 2013080990 A | * 5/2013 |

(Continued)

OTHER PUBLICATIONS

KR-20120033108-A Translation (Year: 2012).*

(Continued)

*Primary Examiner* — Jennifer Wecker
*Assistant Examiner* — Patrick S Ott
(74) *Attorney, Agent, or Firm* — Revolution IP, PLLC

(57) ABSTRACT

An apparatus for depositing a metal film on a surface of a three-dimensional object, includes a mounting drum rotatably disposed inside a chamber and having a circumferential surface onto which a plurality of three-dimensional objects is settled and mounted making each surface thereof to be subjected to deposition be exposed to an outside; and at least one source target depositing a metal film onto the surface of the three-dimensional object mounted to the mounting drum by sputtering.

2 Claims, 5 Drawing Sheets

(56) References Cited

U.S. PATENT DOCUMENTS

2017/0117119 A1* 4/2017 DeVito ............. H01J 37/32733
2017/0141046 A1* 5/2017 Jeong ................. H01L 23/3114
2017/0207071 A1* 7/2017 De Bosscher ........ H01J 37/345

FOREIGN PATENT DOCUMENTS

| KR | 20120033108 A | * | 4/2012 | | |
| KR | 101728401 B1 | * | 4/2017 | | |
| KR | 101800197 B1 | * | 11/2017 | | |
| WO | WO-2017038466 A1 | * | 3/2017 | ............. | C23C 14/50 |

OTHER PUBLICATIONS

JP-2013080990-A Translation (Year: 2013).*
JP-2006299362-A Translation (Year: 2006).*
WO-2017038466-A1 Translation (Year: 2017).*
KR-101728401-B1 Translation (Year: 2017).*
KR-101800197-B1 Translation (Year: 2017).*

* cited by examiner (a)

(b)

(a)

(b)

APPARATUS FOR DEPOSITING METAL FILM ON SURFACE OF THREE-DIMENSIONAL OBJECT

CROSS-REFERENCE TO RELATED APPLICATION

This application claims priority from Korean Patent Application No. 10-2018-0116744, filed on Oct. 1, 2018 in the Korean Intellectual Property Office, the disclosure of which is incorporated herein by reference.

BACKGROUND OF THE INVENTION

(a) Field of the Invention

The disclosure relates to an apparatus for depositing a metal film on a surface of a three-dimensional object, and more particularly to an apparatus for depositing a metal film on a surface of a three-dimensional object, in which a plurality of three-dimensional objects are mounted to a mounting drum so that their three-dimensional surfaces to be subjected to deposition can face toward source targets, and the mounting drum is rotatable, thereby depositing a three-dimensional metal film with improved uniformity and quality on the three-dimensional surface of the three-dimensional object.

(b) Description of the Related Art

To manufacture thin films for various electronic devices, for example, to deposit thin films for shielding electromagnetic interference (EMI) of a semiconductor package, a solar cell, and an organic light emitting diode (OLED) device, there has been used a sputtering apparatus. Specifically, to deposit the thin film for shielding the semiconductor package against the EMI, there has been used an inline sputtering deposition system which performs processes while passing through process modules in a straight line.

Such an inline sputtering deposition system is not applicable to a process requiring high-level step coverage because a target and a tray to which the semiconductor package is mounted are carried facing each other as shown in (a) of FIG. 5 and therefore a thickness of a thin film deposited on the lateral surface of the semiconductor package is below around 40% of a thickness of a thin film deposited on the top of the semiconductor package.

When sputtering is used to deposit the thin film on the semiconductor package, five sides of the package except a bottom side are subjected to the sputtering deposition, and the whole deposition thickness is set based on a side having the thinnest film among the five deposition sides. However, a conventional sputtering apparatus for the semiconductor package provides step coverage not higher than 40% and is hard to secure uniformity of a thin film because of a downward deposition method and an inline system for carrying the semiconductor package tray.

SUMMARY OF THE INVENTION

Accordingly, the disclosure is conceived to solve the foregoing problems, and an aspect of the disclosure is to provide an apparatus for depositing a metal film on a surface of a three-dimensional object, in which a plurality of three-dimensional objects are mounted to a mounting drum so that their three-dimensional surfaces to be subjected to deposition can face toward source targets, and the mounting drum is rotatable, thereby depositing a three-dimensional metal film with improved uniformity and quality on the three-dimensional surface of the three-dimensional object.

Another aspect of the disclosure is to provide an apparatus for depositing a metal film on a surface of a three-dimensional object, in which a semiconductor IC package is applied as the three-dimensional object, thereby efficiently depositing the metal film as an electromagnetic interference (EMI) shielding film with uniform thickness on four lateral surfaces and a top surface of the semiconductor IC package.

In accordance with an embodiment of the present disclosure, there is provided an apparatus for depositing a metal film on a surface of a three-dimensional object, the apparatus comprising: a mounting drum rotatably disposed inside a chamber and comprising a circumferential surface onto which a plurality of three-dimensional objects is settled and mounted making each surface thereof to be subjected to deposition be exposed to an outside; and at least one source target depositing a metal film onto the surface of the three-dimensional object mounted to the mounting drum by sputtering.

Here, the three-dimensional object may be a semiconductor integrated circuit (IC) package, and the metal film may be an electromagnetic interference (EMI) shielding film deposited on a package surface, which comprises four lateral surfaces and a top surface, of the semiconductor IC package.

Further, the mounting drum may be shaped like a polygonal container having a plurality of mounting surfaces, and the plurality of three-dimensional objects may be mounted to a jig settled and disposed on the mounting surface of the mounting drum.

BRIEF DESCRIPTION OF THE DRAWINGS

The above and/or other aspects of the disclosure will become apparent and more readily appreciated from the following description of the exemplary embodiments, taken in conjunction with the accompanying drawings, in which.

DETAILED DESCRIPTION

Figure 1:
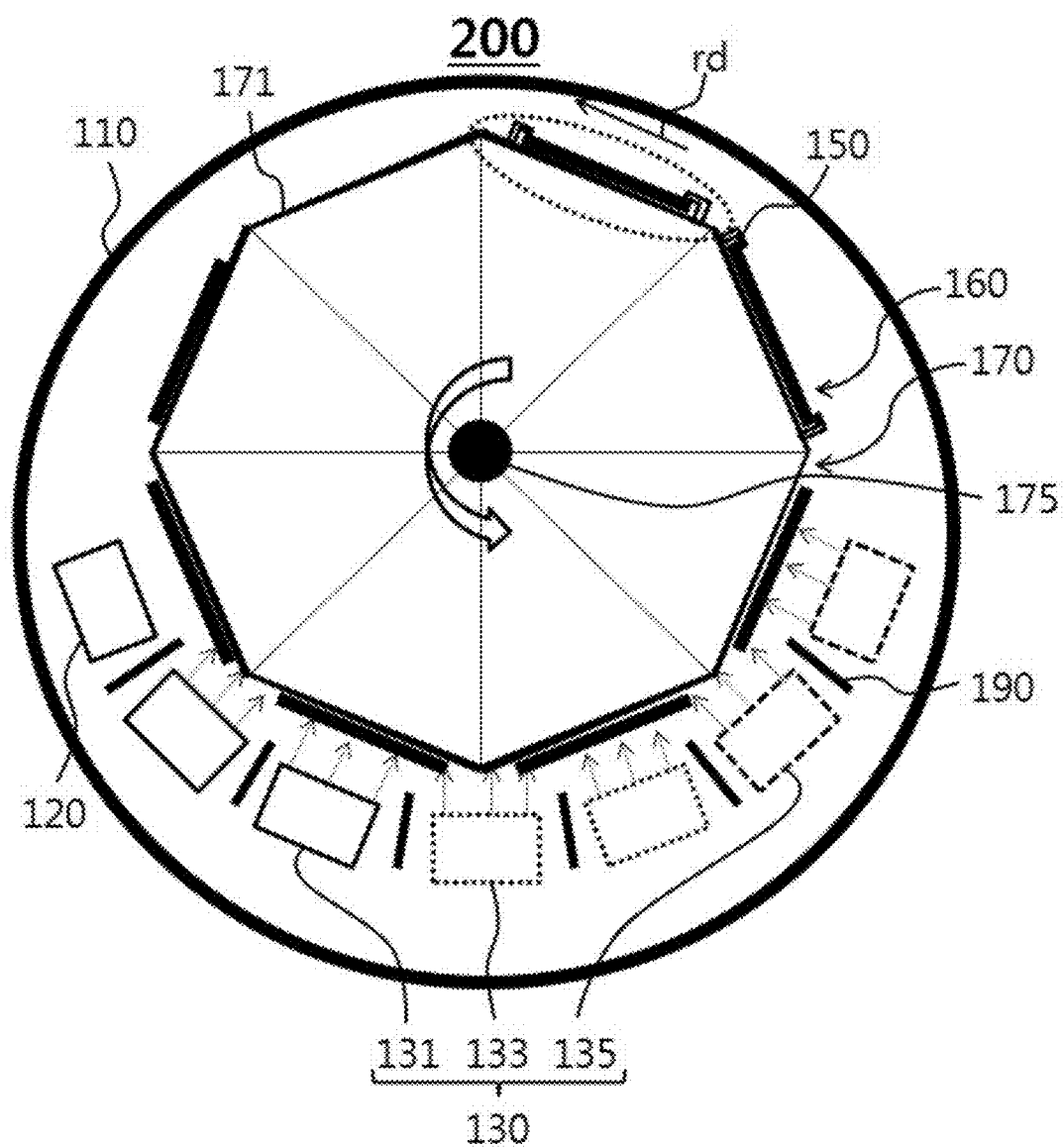
FIG. 1 is a schematic cross-sectional view of an apparatus for depositing a metal film on a surface of a three-dimensional object according to an embodiment of the disclosure.

FIG. 1 is a schematic cross-sectional view of an apparatus for depositing a metal film on a surface of a three-dimensional object according to an embodiment of the disclosure.

As shown in FIG. 1, an apparatus 200 for depositing a metal film on a surface of the three-dimensional object according to an embodiment of the disclosure includes a mounting drum 170 having a circumferential surface to which a plurality of three-dimensional objects are stably mounted, and at least one source target 130 disposed adjacent to the circumferential surface of the mounting drum 170 and performing sputtering to deposit the metal film on the surface of the three-dimensional object. As necessary, a partition 190 may be additionally given to prevent the adjacent source targets 130 from contamination.

The mounting drum 170 is shaped like a cylinder or a polygonal container, and rotatably disposed within a vacuum chamber 110. The plurality of three-dimensional objects (in particular, a semiconductor integrated circuit (IC) package 100 of FIGS. 2 to 5) is mounted to the circumferential surface of the mounting drum 170 (in particular, a mounting surface 171 corresponding to each side of the polygonal prism), so that the surface of the three-dimensional object, to be subjected to deposition, can be exposed to the outside. In other words, the mounting drum 170 according to the disclosure is rotatable within the vacuum chamber 110, and the plurality of three-dimensional objects is settled on and mounted to the circumferential surface of the mounting drum 170 while exposing the surface thereof to be subjected to the deposition to the outside.

Specifically, the mounting drum 170 has a cylindrical shape or poly-prism shape, a rotary rod 175 is connected to at least one of the top side and bottom side of the mounting drum 170, and the plurality of three-dimensional objects is settled on and mounted to the mounting surface 171 corresponding to a flat portion of the circumferential surface. The rotary rod 175 is rotatably coupled within the vacuum chamber 110. In result, the mounting drum 170 is rotatably disposed within the vacuum chamber 110 while the plurality of three-dimensional objects (e.g. the semiconductor IC package) is stably mounted to the mounting surface 171.

Like this, the plurality of three-dimensional objects is settled on and mounted to the circumferential surface of the mounting drum 170 while exposing the surface to be subjected to the deposition to the outside, and therefore the surface to be subjected to the deposition is disposed protruding from the circumferential surface 171 of the mounting drum 170. According to the disclosure, the apparatus 200 for depositing the metal film on the surface of the three-dimensional object refers to a deposition apparatus for depositing the metal film onto the surface of the three-dimensional object such as the semiconductor IC package, and therefore the surface of the semiconductor IC package and the like three-dimensional object is disposed to be exposed on the circumferential surface 171 of the mounting drum 170.

The plurality of three-dimensional objects, which is mounted on the circumferential surface 171 of the mounting drum 170 so that the surface to be subjected to the deposition can be exposed to the outside as described above, undergoes sputtering based on at least one source target 130. Therefore, at least one source target 130 is disposed to deposit a predetermined metal film onto the surface of the plurality of three-dimensional objects. In other words, at least one source target 130 carries out sputtering operation to deposit the metal film onto the exposed surface of the three-dimensional object mounted to the circumferential surface 171 of the mounting drum 170.

The source target 130 is formed as a metal target to be deposited on the surface of the three-dimensional object, and the metal target operates as a cathode during a sputtering process. The source target 130 corresponding to the metal target functioning as the cathode deposits the metal film including at least one metal layer on the surface of the three-dimensional object.

Meanwhile, the mounting drum 170 having the cylindrical or polygonal-prism shape is rotatable during the sputtering process performed by the source target 130, so that the source target 130 can perform three-dimensional deposition with regard to the surfaces of the three-dimensional object (e.g. the four lateral surfaces and top surface of the three-dimensional object such as the semiconductor IC package).

Accordingly, in the apparatus 200 for the deposition on the surface of the three-dimensional object according to the disclosure, a complicated source target for carrying out sputtering to the top surface and four lateral surfaces of the three-dimensional object and an additional element for driving the complicated source target are not needed for the three-dimensional deposition on the surfaces of the three-dimensional object, and a simple source target is enough to perform the three-dimensional deposition with regard to the surfaces of the three-dimensional object.

As described above, the apparatus 200 for the deposition on the surface of the three-dimensional object according to the disclosure does not perform the deposition with regard to a simple surface corresponding to one plane, but carries out the deposition with regard to the surfaces of the three-dimensional object such as the semiconductor IC package, i.e. the three-dimensional surfaces corresponding to the four lateral surfaces and top surface, thereby forming a metal film, in particular, a film for shielding electromagnetic interference (EMI).

According to the disclosure, the three-dimensional object refers to any three-dimensional object that needs to form the metal film on the surface thereof and have surfaces corresponding to at least two planes, i.e. three-dimensional surfaces to be subjected to the deposition for the metal film. In particular, according to the disclosure, the three-dimensional object is the semiconductor IC package, and the metal film is an EMI shielding film to be deposited on a package surface 10 that includes four lateral surfaces (i.e. package lateral surfaces 13) and a top surface (i.e. package top surface 11) of the semiconductor IC package.

Therefore, unless otherwise additionally described below, the three-dimensional object means the semiconductor IC package, the metal film means the EMI shielding film, and the surface means the package surface 10 including four lateral surfaces (i.e. package lateral surfaces: 13) and the top surface (i.e. package top surface: 11).

Figure 2:
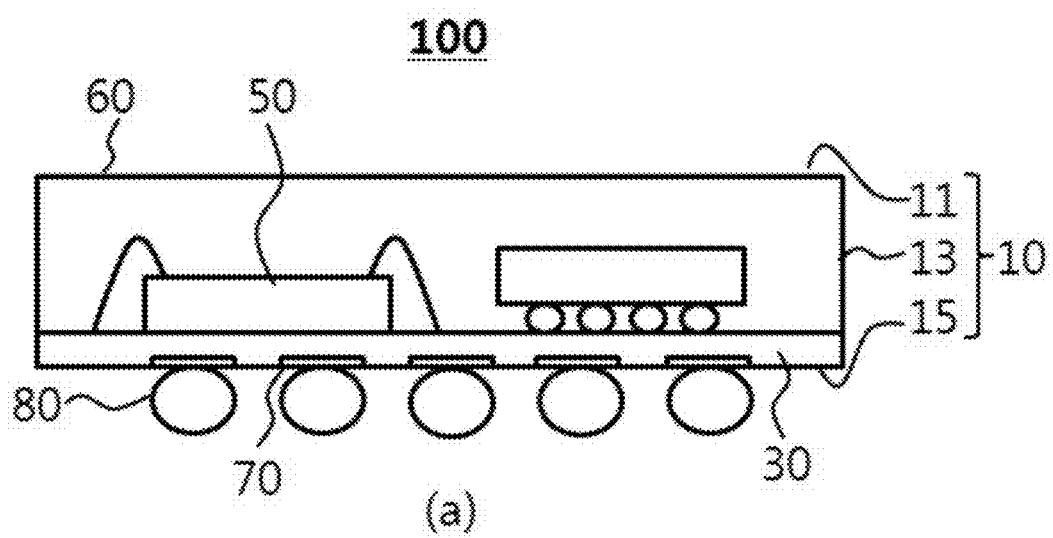
FIG. 2 is a schematic cross-sectional view of showing a three-dimensional object according to the disclosure, i.e. a semiconductor integrated circuit (IC) package and a metal film deposited on the surface of the three-dimensional object.
Figure 2:
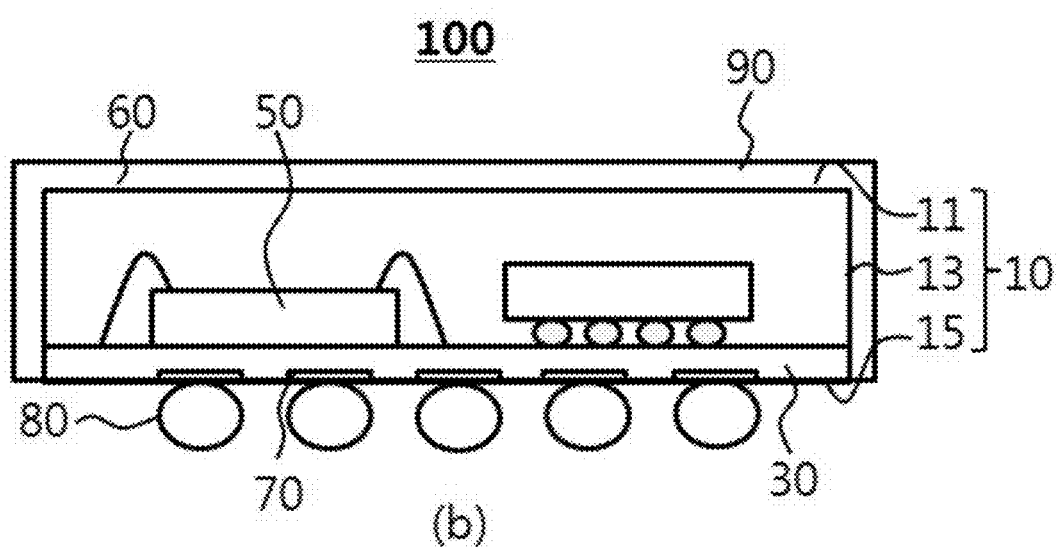

As the three-dimensional object according to the disclosure, the semiconductor IC package 100 has a cubic shape as shown in FIG. 2, and includes a metal film 90 on the external surface, i.e. the package surface 10 thereof. Here, the metal film 90 is the EMI shielding film formed on the surfaces of the semiconductor IC package 100. Further, the metal film 90 used as the EMI shielding film corresponds to the surfaces of the semiconductor IC package, for example, the package surface 10 including the package lateral surfaces 13 equivalent to the four lateral surfaces, and the package top surface 11 equivalent to the top surface.

As shown in FIG. 2, the semiconductor IC package 100 includes a substrate 30, various active and passive devices (not shown) and various chips 50 such as a controller and the like embedded on the substrate 30, and a protection cap 60 formed on the substrate 30 and protecting various chips 50 and the like. The bottom surface of the substrate 30, i.e. a package bottom surface 15 may be formed with an input/output (IO) pad 70 for electric connection, and a solder ball 80 may be formed on the IO pad 70.

The semiconductor IC package 100 formed with the foregoing structure needs to include the metal film 90 as the EMI shielding film on the surfaces of the protection cap 60, i.e. the package surface 10 including the package top surface 11 and the package lateral surfaces 13 corresponding to four lateral surfaces. According to the disclosure, the metal film, i.e. the EMI shielding film is deposited on portions corresponding to the package top surface 11 and the package lateral surfaces 13, but should not be deposited on the package bottom surface 15 to be formed with the IO pad 70, the solder ball 80, etc. Therefore, the package bottom surface 15 is prevented from being exposed to the outside during the deposition process.

Below, the apparatus 200 for the deposition on the surface of the three-dimensional object according to the disclosure will be described in detail with respect to more concrete technical features and additional technical features.

The apparatus 200 for the deposition on the surface of the three-dimensional object according to the disclosure needs to employ a configuration in which the deposition process is carried out in the state that the plurality of three-dimensional objects (preferably, the semiconductor IC packages 100) are all stably mounted to the mounting drum 170, so that the metal film 90 can be deposited on the surfaces of the plurality of three-dimensional objects (preferably, the semiconductor IC packages 100).

To this end, the mounting drum 170 according to the disclosure may be shaped like the polygonal prism having the plurality of mounting surface 171, and the plurality of three-dimensional objects (preferably, the semiconductor IC packages 100) may be mounted to a jig 160 fastened to the mounting surface 171 of the mounting drum 170.

Specifically, the mounting drum 170 has only to be shaped like a container and rotatably mounted within the vacuum chamber 110. Preferably, the mounting drum 170 has a polygonal-prism shape making it possible to form the mounting surface 171 corresponding to a plane so that the jig 160 mounted with the plurality of three-dimensional objects can be stably settled and disposed.

Therefore, the mounting drum 170 according to the disclosure is shaped like a polygonal prism, and thus has a plurality of mounting surfaces 171 corresponding to the lateral surfaces of the polygonal prism, so that the jig 160, to which the plurality of three-dimensional objects is mounted, can be stably settled on each flat mounting surface 171.

The plurality of three-dimensional objects can be mounted to the circumferential surfaces of the mounting drum 170, i.e. the mounting surfaces 171 as they are fastened and mounted to the jig 160. In this case, the jig 160 may be mounted with as many three-dimensional objects as possible, thereby improving production efficiency.

Figure 3:
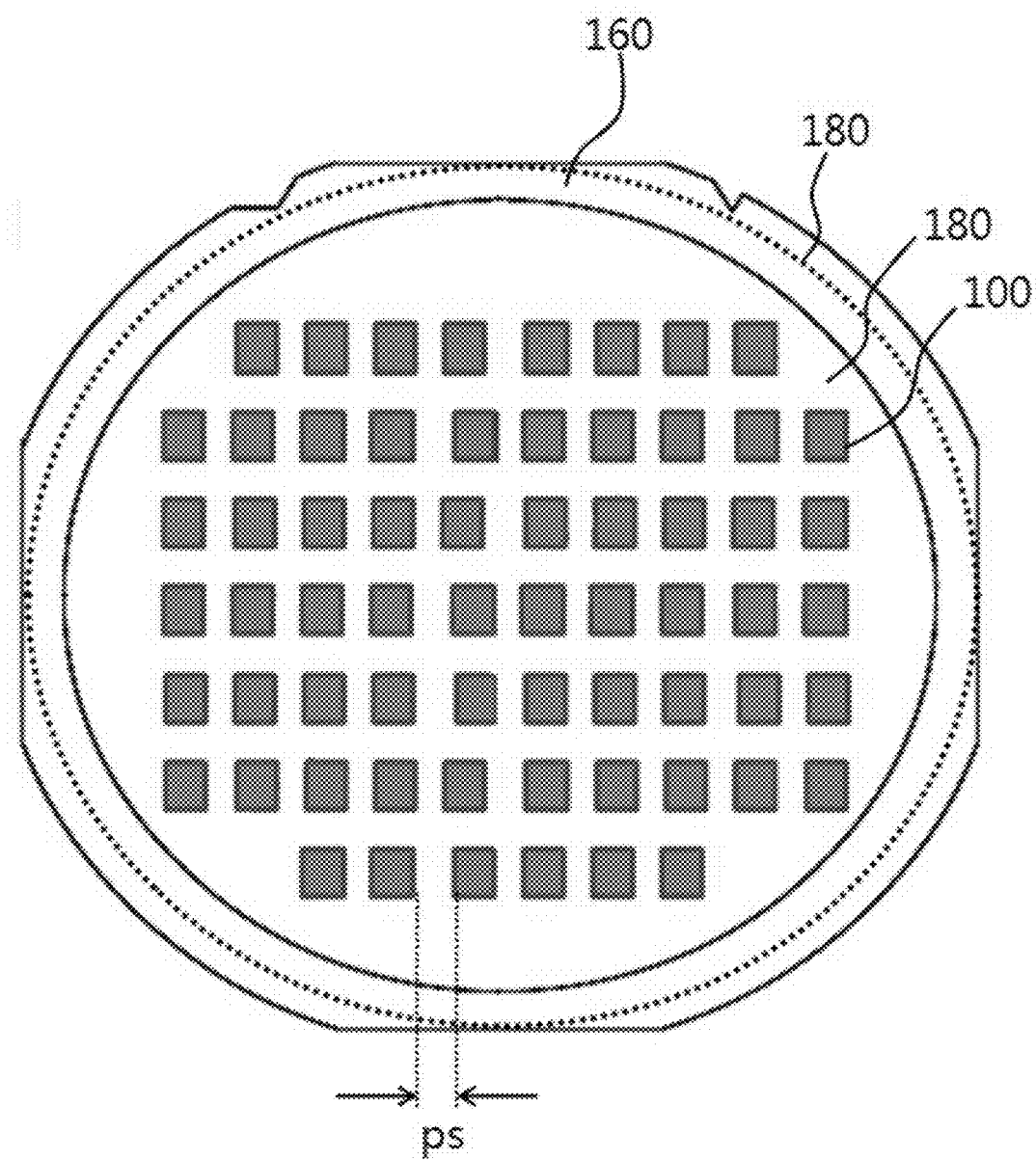
FIG. 3 is a plan view showing a jig in an apparatus for depositing a metal film on a surface of a three-dimensional object according to an embodiment of the disclosure.
Figure 4:
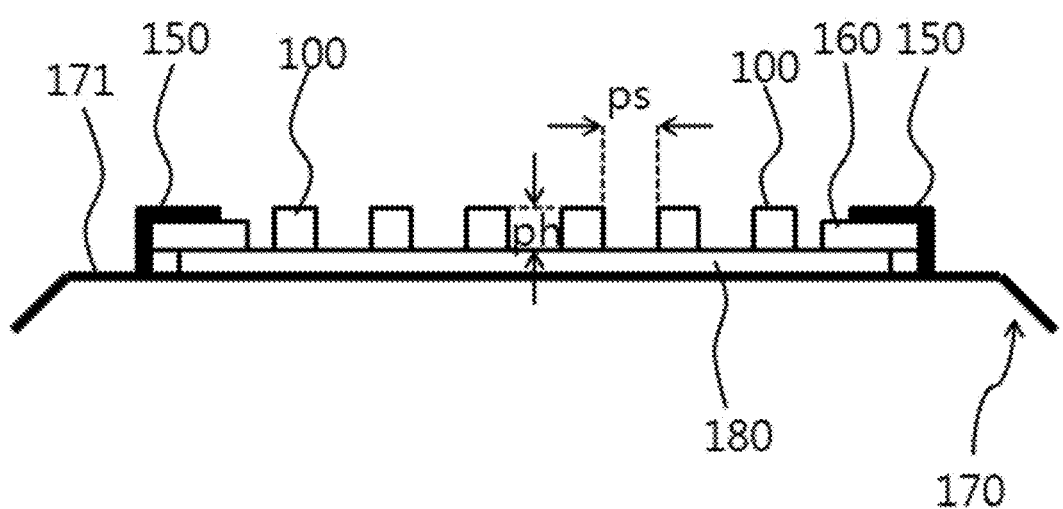
FIG. 4 is a partial enlarged view of an apparatus for depositing a metal film on a surface of a three-dimensional object according to an embodiment of the disclosure.

To this end, as shown in FIGS. 3 and 4, according to the disclosure, the semiconductor IC packages 100 corresponding to the plurality of three-dimensional objects are stably fastened and mounted to the jig 160 by an adhesive film 180. Specifically, the plurality of three-dimensional objects are mounted onto the adhesive film 180 and spaced apart from one another at predetermined intervals. In this case, the bottom surfaces, i.e. the package bottom surfaces 15 of the plurality of three-dimensional objects, i.e. the semiconductor IC packages 100 are attached to the adhesive film 180. Therefore, the package bottom surfaces 15 of the plurality of three-dimensional objects are not exposed to the outside during the deposition process, and thus not subjected to the deposition.

The adhesive film 180 having atop surface (i.e. adhesive surface), to which the plurality of three-dimensional objects is attached, is held by the jig 160. The jig 160 may have a structure of a flat plate and be attached to and supported by the bottom surface of the adhesive film 180 having the top surface to which the plurality of three-dimensional objects is attached. However, such a structure has a problem that adhesive materials have to be applied to both the top and bottom surfaces of the adhesive film 180, and time, efforts and costs needed for coupling the jig 160 with the adhesive film 180, to which the plurality of three-dimensional objects are attached, are increased as the adhesive area of the jig 160 becomes larger.

Therefore, the jig 160 according to the disclosure may be shaped like a ring frame of stainless steel instead of a structure of a flat plate. In other words, the jig 160 according to the disclosure has a ring frame shape as shown in FIGS. 3 and 4, and is attached to a rim portion of the adhesive film 180 to which the plurality of three-dimensional objects, i.e. the semiconductor IC packages 100 are attached.

With this structure, the plurality of three-dimensional objects according to the disclosure is stably mounted to the jig 160 by a medium of the adhesive film 180, and the jig 160 is stably settled and disposed on the mounting surface 171 of the mounting drum 170, so that the plurality of three-dimensional objects (preferably, semiconductor IC packages 100) can be stably mounted to the mounting surfaces 171 corresponding to the circumferential surface of the mounting drum 170.

The jig 160 needs to be stably settled and disposed on the mounting surface 171 of the mounting drum 170. To this end, the jig 160 may be attached to the mounting surface 171 of the mounting drum 170 by a separate adhesive means, or may be stably fastened by a separate clamping means. However, such a separate means may make it difficult to mount and separate the jig 160 and cause a complicated structure.

Therefore, the disclosure provides a simple structure where the jig 160 is easily mounted and separated, and the jig 160 maintains its position stably without movement or separation even while the mounting drum 170 rotates. Specifically, according to the disclosure, as shown in FIGS. 1 and 4, holding slots 150 protruding from the mounting surface 171 of the mounting drum 170 and facing each other are provided to hold the opposite edges of the jig 160.

The holding slots 150 form a pair as shown in FIGS. 1 and 4, and are spaced apart facing each other while each having an "¬"-shape protruding from the mounting surface 171 of the mounting drum 170. The holding slots 150 are formed on the mounting surface 171 of the mounting drum 170, and disposed in a direction perpendicular to a rotating direction of the mounting drum 170, i.e. a drum rotating direction rd. In results, the jig 160 sliding and coupling to the holding slots 150 is supported by the holding slots 150 and maintains a stable state without movement and separation while the mounting drum 170 is rotating in the drum rotating direction rd.

One pair of holding slots 150 is disposed lengthwise in the direction perpendicular to the rotating direction of the mounting drum 170, i.e. to the drum rotating direction rd, so that the jig 160 can be inserted in and coupled to the holding slots 150 as sliding from the lateral side in a direction perpendicular to the rotating direction of the mounting drum 170.

Like this, according to the disclosure, the holding slots 150 are protruding from the mounting surface 171 and facing each other so that the jig 160, to which the plurality of three-dimensional objects (i.e. semiconductor IC packages 100) are mounted by the adhesive film 180, can slide and settle on the mounting surface 171 of the mounting drum 170, thereby having effects on stably maintaining the jig 160 while the mounting drum 170 is rotating, and making it easy to mount and separate the jig 160.

Meanwhile, the plurality of three-dimensional objects (i.e. semiconductor IC packages 100) are attached to the adhesive film 180 and spaced apart from each other at predetermined intervals. However, a space between the plurality of three-dimensional objects (i.e. semiconductor IC packages 100) attached onto the adhesive film 180, i.e. a package spacing distance ps needs to be greater than the height of the plurality of three-dimensional objects (i.e. semiconductor IC package 100), i.e. a package height ph.

Like this, the plurality of three-dimensional objects (i.e. semiconductor IC packages 100) according to the disclosure have to be arranged having the package spacing distance ps greater than the package height ph. With this structure, the metal film 90 can be deposited having a uniform thickness onto the lateral surfaces, i.e. the package lateral surfaces 13 of the semiconductor IC package. Specifically, with this arrangement structure, as shown in (b) of FIG. 5, deposition is applied up to the lateral surfaces of the semiconductor IC package 100, i.e. up to a deep portion (i.e. a portion adjacent to the substrate) of the package lateral surfaces 13 while the mounting drum 170 is rotating, thereby depositing the metal film 90 to have uniform thickness on the lateral surfaces, i.e. the package lateral surfaces 13 of the semiconductor IC package 100.

Meanwhile, the apparatus 200 for the deposition on the surface of the three-dimensional object according to an embodiment of the disclosure surface may include a plurality of source targets 130 as shown in FIG. 1. That is, a single source target 130 may be provided to deposit a three-dimensional metal film onto the three-dimensional surfaces of the plurality of three-dimensional objects (i.e. semiconductor IC packages 100) rotating inside the vacuum chamber 110. However, a plurality of source targets 131, 133 and 135 may be provided to deposit the three-dimensional metal film onto the three-dimensional surfaces (i.e. the package surface 10 including the package top surface 11 and the package lateral surfaces 13) of the plurality of rotating three-dimensional objects (i.e. semiconductor IC packages 100). FIG. 1 illustrates that the source target 130 includes a plurality of source targets, i.e. a first source target 131, a second source target 133, a third source target 135, and other additional source targets. However, the source target 130 may include more source targets than those illustrated in FIG. 1, and the source targets may be more densely arranged.

As described above, when the source target 130 includes a plurality of source targets, the plurality of source targets (e.g. the source targets including the first source target 131, the second source target 133 and the third source target 135 as shown in FIG. 1) may be used as cathode targets of one metal, i.e. identical metal targets, or may be used as cathode targets of different metals, i.e. different metal targets.

Like this, the source target 130 according to the disclosure may include the plurality of source targets 131, 133, and 135, and the plurality of source targets (e.g. the source targets including the first source target 131, the second source target 133 and the third source target 135 as shown in FIG. 1) may be actualized by the identical metal targets or the different metal targets.

The former case (where the source target includes a plurality of source targets, and the plurality of source targets are actualized by identical metal targets) is used to form an EMI shielding film corresponding to the metal film 90 including one metal layer on the three-dimensional surfaces of the plurality of three-dimensional objects (i.e. semiconductor IC packages 100). In other words, the plurality of source targets are actualized by the identical metal targets of one metal.

Like this, when the plurality of source targets 130 are actualized by the identical metal targets, the three-dimensional surfaces of the plurality of three-dimensional objects (i.e. semiconductor IC packages 100) continuously undergo sputtering while the mounting drum 170 is rotating, so that the metal film 90 corresponding to the EMI shielding film can be deposited. In result, it is possible to speed up the deposition of the metal film onto the three-dimensional surfaces of the plurality of three-dimensional objects (i.e. semiconductor IC packages 100), thereby improving production and deposition efficiencies.

As described above, when the source target 130 includes the plurality of identical metal targets, spaces between the source targets, i.e. between the metal targets may be adjusted based on efficiency and quality of the metal film deposition on the three-dimensional surfaces of the plurality of three-dimensional objects (i.e. semiconductor IC packages 100). Actually, the narrower the space between the source targets, the better. It is preferable that the source targets are more densely arranged than those shown in FIG. 1.

Next, the latter case (where the source target includes a plurality of source targets, and the plurality of source targets are actualized by different metal targets) is used to form an EMI shielding film corresponding to the metal film 90 including a plurality of metal layers on the three-dimensional surfaces of the plurality of three-dimensional objects (i.e. semiconductor IC packages 100). In other words, the plurality of source targets are actualized by the different metal targets of different metals.

For example, as shown in FIG. 1, when the source target 130 includes three source targets, i.e. the first source target 131, the second source target 133, the third source target 135, and other source targets, different metal targets are used as the first source target 131, the second source target 133 and the third source target 135. In this case, the first source target 131 may deposit a first metal layer (e.g. a stainless-steel layer) on the three-dimensional surfaces of the plurality of three-dimensional objects (i.e. semiconductor IC packages 100), the second source target 133 may deposit a second metal layer (e.g. a copper layer) on the first metal layer, and the third source target 135 may deposit a third metal layer (e.g. a stainless-steel layer) on the second metal layer. Here, the metal film 90 deposited on the three-dimensional surfaces of the plurality of three-dimensional objects (i.e. semiconductor IC packages 100) is formed by depositing the first metal layer (e.g. the stainless-steel (SUS) layer), the second metal layer (e.g. the copper (Cu) layer), and the third metal layer (e.g. the stainless-steel (SUS) layer) in sequence.

Like this, when the source target 130 includes a plurality of source targets 130 and the plurality of source targets are actualized by the different metal targets, only a specific source target 130 operates to perform sputtering, and the other source targets do not carry out the sputtering. In other words, only a certain source target is controlled to operate, and the other source targets are controlled not to operate.

When only one source target operates to perform sputtering, the three-dimensional deposition is applied to the three-dimensional surfaces of the plurality of three-dimensional objects (i.e. semiconductor IC packages 100) mounted to the mounting drum 170 as the mounting drum 170 rotates. In other words, first metal of the source target carrying out the sputtering is deposited on the three-dimensional surfaces of the plurality of three-dimensional objects (i.e. semiconductor IC packages 100) mounted to the mounting drum 170, thereby forming a first metal layer. For example, referring to FIG. 1, when only the first source target 131 operates to carry out the sputtering but the second source target 133 and the third source target 135 do not operate, the first metal is sputtered from the first source target 131 and the first metal layer is deposited onto the three-dimensional surfaces of the plurality of three-dimensional objects (i.e. semiconductor IC packages 100).

When the deposition of the first metal layer is completed, only a source target (e.g. the second source target 133), which is different from and adjacent to the source target (e.g. the first source target 131) sputtering the first metal layer, operates to carry out the sputtering, and the other source targets (e.g. the first source target 131 and the third source target 135) do not operate. Eventually, the second metal is sputtered from the second source target 133 to the three-dimensional surfaces of the plurality of three-dimensional objects (i.e. semiconductor IC packages 100), and thus the second metal layer is deposited on the first metal layer.

When the deposition of the second metal layer is completed, only a source target (e.g. the third source target 135), which is different from and adjacent to the source target (e.g. the second source target 133) sputtering the second metal layer, operates to carry out the sputtering, and the other source targets (e.g. the first source target 131 and the second source target 133) do not operate. Eventually, the third metal is sputtered from the third source target 135 to the three-dimensional surfaces of the plurality of three-dimensional objects (i.e. semiconductor IC packages 100), and thus the third metal layer is deposited on the second metal layer.

Thus, the plurality of source targets 130 operate in sequence so that the corresponding metal layers are sequentially sputtered and stacked on the three-dimensional surfaces of the plurality of three-dimensional objects (i.e. semiconductor IC packages 100), thereby ultimately forming the metal film 90 including a plurality of metal layers, i.e. the EMI shielding film on the three-dimensional surfaces of the plurality of three-dimensional objects (i.e. semiconductor IC packages 100).

Like this, when the source target 130 includes a plurality of source targets and the plurality of source targets 130 are respectively actualized by different metal targets, only a certain source target for a specific metal target operates among the plurality of source targets and is controlled to sputter metal corresponding to the specific metal target to the substrate lateral surfaces.

During these operations, a source target (e.g. the second source target 133) different from and adjacent to a certain source target (e.g. the first source target 131) needs to be prevented from contamination caused by the sputtering of the metal target corresponding to the certain source target. In other words, metal of a specific metal target of a certain source target has to be prevented from being deposited on other metal targets corresponding to other adjacent source targets.

To this end, as shown in FIG. 1, the apparatus 200 for the deposition on the surface of the three-dimensional object according to the disclosure may further include a partition 190 between a certain source target and other adjacent source targets, thereby preventing metal of the certain source target carrying out the sputtering from being deposited to other adjacent source targets. In other words, according to the disclosure, when the plurality of source targets 130 are actualized by different metal targets, the partition 190 is further provided between the source target 130 performing the sputtering and other adjacent source targets 130.

In the foregoing description, each of the source targets, i.e. the first source target 131, the second source target 133 and the third source target 135 is provided as each individual source target. Alternatively, each source target may include a plurality of identical metal targets. That is, the source targets may be actualized by a plurality of identical metal target groups. Therefore, a plurality of identical metal targets for the first source target may perform sputtering to deposit the first metal layer.

Meanwhile, the apparatus 200 for depositing the metal film on the surface of the three-dimensional object according to the disclosure may further include a configuration for preprocessing the surfaces of the plurality of three-dimensional objects (i.e. semiconductor IC packages 100) before performing a process for depositing the metal film 90 on the surfaces of the plurality of three-dimensional objects (i.e. semiconductor IC packages 100).

In addition, fine particles may be present on the surfaces of the plurality of three-dimensional objects (i.e. semiconductor IC packages 100). To remove such fine particles before the deposition, plasma-based preprocessing may be further performed for precise cleansing. When such plasma-based preprocessing is performed, adverse effects caused by the fine particles are prevented.

Further, the apparatus 200 for depositing the metal film on the surface of the three-dimensional object according to the disclosure may further include an ion-beam generator 120 to preprocess the surfaces of the plurality of three-dimensional objects (i.e. semiconductor IC packages 100) by ion beams inside the vacuum chamber 110 before the process for forming the metal film 90 on the surfaces of the plurality of three-dimensional objects (i.e. semiconductor IC packages 100).

In other words, to enhance adhesion and close-contact between the metal film 90 corresponding to the EMI shielding film and the three-dimensional surfaces of the plurality of three-dimensional objects (i.e. semiconductor IC packages 100), an ion-beam process is performed in the vacuum chamber 110 before performing the sputtering to deposit the metal film 90 on the surfaces of the plurality of three-dimensional objects (i.e. semiconductor IC packages 100). To this end, only an ion-beam gun corresponding to an ion beam generator 120 for the ion-beam process is added to the vacuum chamber 110.

Like this, according to the disclosure, the preprocess for the surface of the three-dimensional object (e.g. the semiconductor IC package 100) is performed by the ion-beam process in the same chamber as the vacuum chamber for forming the metal film (e.g. the EMI shielding film) on the surface of the three-dimensional object (e.g. the semiconductor IC package 100), thereby simplifying the processes to enhance the adhesion and close-contact for the surface of the three-dimensional object (e.g. the semiconductor IC package), and thus reducing time, efforts and costs in manufacturing the three-dimensional object (e.g. the semiconductor IC package) with high quality. Further, when the metal film (e.g. the EMI shielding film) deposited on the surface of the three-dimensional object (e.g. the semiconductor IC package) includes a plurality of metal layers, the ion-beam process may be carried out in one chamber with respect to each of the metal layers, thereby further improving the adhesion and close-contact between the metal layers.

Figure 5:
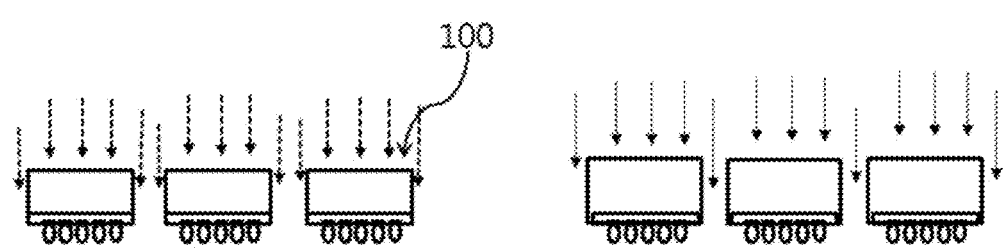
FIG. 5 is a schematic cross-sectional view showing comparison between a conventional depositing operation and a depositing operation based on an apparatus for depositing a metal film on a surface of a three-dimensional object according to an embodiment of the disclosure.
Figure 5:
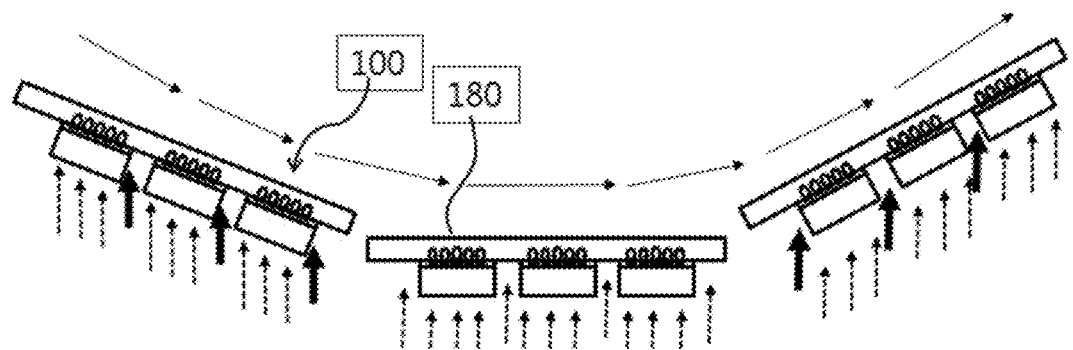

As described above, the apparatus 200 for depositing the metal film on the surface of the three-dimensional object according to the disclosure, as shown in FIG. 5, is improved in deposition efficiency with respect to the package lateral surface as compared with that of a conventional method of depositing the metal film on the surface of the three-dimensional object. Specifically, by the conventional method of deposition for the surface of the three-dimensional object, as shown in (a) of FIG. 5, the metal film is uniformly deposited on only the top surface of the three-dimensional object, but the metal film is hardly deposited or deposited without uniformity of thickness on the lateral surfaces. On the other hand, the apparatus for depositing the metal film on the surface of the three-dimensional object according to the disclosure, as shown in (b) of FIG. 5, the metal film can be uniformly deposited on not only the top surface but also the lateral surfaces of the three-dimensional object (e.g. the semiconductor IC package 100) as the mounting drum rotates. Therefore, the apparatus 200 for depositing the metal film on the surface of the three-dimensional object according to the disclosure improves deposition efficiency of the metal film onto the surfaces of the three-dimensional object (e.g. the semiconductor IC package 100).

According to the disclosure, a plurality of three-dimensional objects are mounted to a mounting drum so that their three-dimensional surfaces to be subjected to deposition can face toward source targets, and the mounting drum is rotatable, thereby depositing a three-dimensional metal film with improved uniformity and quality on the three-dimensional surface of the three-dimensional object.

Further, a semiconductor IC package is applicable as the three-dimensional object, thereby efficiently depositing the metal film as an electromagnetic interference (EMI) shielding film with uniform thickness on four lateral surfaces and a top surface of the semiconductor IC package.

Although a few exemplary embodiments of the disclosure have been shown and described, these are for illustrative purpose only and it will be appreciated by those skilled in the art that changes may be made in these embodiments without departing from the principles and spirit of the invention, the scope of which is defined in the appended claims and their equivalents.

What is claimed is:

1. An apparatus for depositing a metal film on a surface of a three-dimensional object, the apparatus comprising:
   a mounting drum rotatably disposed inside a chamber and comprising a circumferential surface onto which a plurality of three-dimensional objects is settled and mounted making each surface thereof to be subjected to deposition be exposed to an outside;
   a plurality of source targets depositing a metal film onto the surface of the three-dimensional object mounted to the mounting drum by sputtering; and
   a partition disposed between each of the plurality of source targets,
   wherein the mounting drum has a polygonal shape and comprises a plurality of mounting surfaces, and the plurality of three-dimensional objects are fastened and mounted to a jig settled and disposed on each one of the plurality of mounting surfaces of the mounting drum,
   wherein, during deposition, one target of the plurality of source targets is aligned with a first mounting surface of the plurality of mounting surfaces, and another source target of the plurality of source targets is aligned with an edge between the first mounting surface and an adjacent mounting surface,
   wherein the plurality of three-dimensional objects are attached to an adhesive film, and the adhesive film is held by the jig having a ring frame shape,
   wherein a pair of holding slots is formed on each one of the plurality of mounting surfaces of the mounting drum and disposed in a direction perpendicular to a rotating direction of the mounting drum, each holding slot being protruded from the each mounting surface and facing each other so that the jig is inserted in and coupled to the each holding slot as sliding from a lateral side in a direction perpendicular to a rotating direction of the mounting drum,
   wherein the plurality of three-dimensional objects are spaced apart from one another, a space distance between each three-dimensional object greater than a height of the each three-dimensional object.

2. The apparatus according to claim 1, wherein the each three-dimensional object comprises a semiconductor integrated circuit (IC) package, and the metal film comprises an electromagnetic interference (EMI) shielding film deposited on a package surface, which comprises four lateral surfaces and a top surface, of the semiconductor IC package.

* * * * *